United States Patent [19]

Fletcher

[11] Patent Number: 4,874,971
[45] Date of Patent: Oct. 17, 1989

[54] EDGE-SENSITIVE DYNAMIC SWITCH

[75] Inventor: Thomas D. Fletcher, Orem, Utah

[73] Assignee: North American Philips Corporation, Signetics Division, Sunnyvale, Calif.

[21] Appl. No.: 180,425

[22] Filed: Apr. 8, 1988

Related U.S. Application Data

[63] Continuation-in-part of Ser. No. 934,753, Nov. 25, 1986, Pat. No. 4,740,717.

[51] Int. Cl.$^4$ .............................................. H03K 5/153
[52] U.S. Cl. .................................. 307/605; 307/573; 307/576; 307/594; 307/517
[58] Field of Search ................ 307/443, 573, 575, 576, 307/585, 597, 601, 605, 266, 261, 517, 518, 594, 273; 328/114

[56] References Cited

U.S. PATENT DOCUMENTS 4,039,858 8/1977 Stewart .

FOREIGN PATENT DOCUMENTS

0242721 12/1985 Japan .................................. 307/576

Primary Examiner—John Zazworsky
Attorney, Agent, or Firm—R. Meetin; D. Treacy; T. Briody

[57] ABSTRACT

An edge-sensitive dynamic switch center around a transmission gate (16) formed with a pair of complementary FET's ($Q_N$ and $Q_P$) coupled together in parallel between a pair of nodes (1 and 2). The signals at the two nodes vary between a low voltage level and a high voltage level. An inverter (17) is coupled between the gate electrodes of the FET's. A delay element (18) is coupled between one of the nodes and one of the gate electrodes. Due to the transmission delays through the delay element and the inverter, the switch turns off with a controlled delay.

11 Claims, 5 Drawing Sheets

EDGE-SENSITIVE DYNAMIC SWITCH

CROSS-REFERENCE TO RELATED APPLICATION

This is a continuation-in-part of U.S. patent application Ser. No. 934,753, filed November 25, 1986 now U.S. Pat. No. 4,740,717.

FIELD OF USE

This invention relates to an electronic circuitry employing transmission gates formed with complementary field-effect transistors (FET's).

BACKGROUND ART

A useful building block for a semiconductor integrated circuit (IC) is a transmission gate consisting of a pair of opposite-polarity FET's connected in parallel. Depending on the signals that control the gate, it can be placed in a conductive condition across the full range of the IC power supply voltage. This is highly desirable in many applications.

Figure 1:
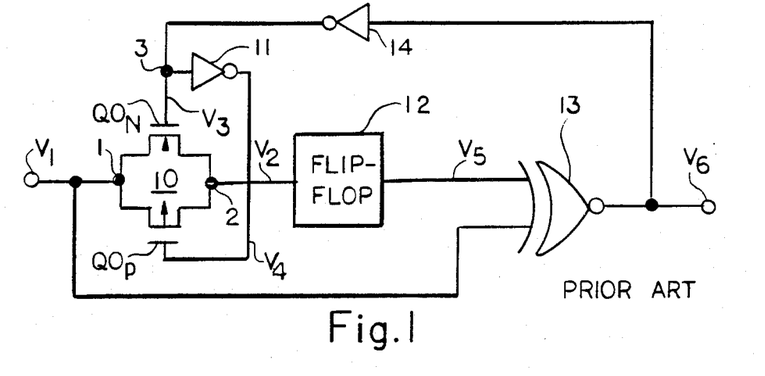
FIG. 1 is a block/circuit diagram of a prior art transition detector.

Referring to FIG. 1, it illustrates how a transmission gate 10 is used in a transition detector as disclosed in U.S. Pat. No. 4,039,858. Gate 10 is composed of an N-channel insulated-gate FET $Q0_N$ and a P-channel insulated-gate FET $Q0_P$. One source/drain element of FET $Q0_N$ is connected to one source/drain element of FET $Q0_P$ by way of a node 1 at which a gate input signal $V_1$ is received. The other source/drain element of FET $Q0_N$ is connected to the other source/drain element of FET $Q0_P$ via a node 2 at which a gate output signal $V_2$ is supplied.

An inverter 11 is connected between the gate electrodes. In response to a signal $V_3$ provided from a node 3 connected to the $Q0_N$ gate electrode, inverter 11 supplies an inverse signal $V_4$ to the $Q0_P$ gate electrode.

Signal $V_2$ is provided to a flip-flop 12 that supplies a signal $V_5$ representing the flip-flop state. Signal $V_2$ controls flip-flop 12 when transmission gate 10 is conductive. An EXCLUSIVE NOR gate 13 provides a detection signal $V_6$ as the EXCLUSIVE NOR of signals $V_1$ and $V_5$. The final component of the transition detector is an inverter 14 that generates signal $V_3$ by inverting signal $V_6$.

The transition detector operates as follows. Both of FET's $Q0_N$ and $Q0_P$ are normally off so that gate 10 is non-conductive. Signal $V_6$ is normally at a high voltage. When signal $V_1$ makes a voltage transition in one direction, the signal transmission delays through the detector enable gate 10 to turn on briefly. This causes a pulse indicative of the transition to appear in signal $V_6$. A similar pulse occurs in signal $V_6$ when signal $V_1$ later makes a transition in the opposite direction.

GENERAL DISCLOSURE OF THE INVENTION

The present invention centers around an electronic circuit in which the transmission delays through circuit components employed with a transmission gate enable the circuit to function as an edge-sensitive dynamic switch with a controlled turn-off delay. The transmission gate is formed with a pair of complementary FET's, each having a first source/drain element, a second source/drain element, and a gate electrode. The first source/drain elements are coupled together through a first node at which a first signal is present. The second source/drain elements are similarly coupled together through a second node at which a second signal is present. An inverter responsive to a third signal at a third node coupled to the gate electrode of one of the FET's provides a substantially inverse fourth signal to the gate electrode of the other FET.

A critical part of the switch is a delay element that causes the third signal to continually follow the first signal, either directly or inversely, by a specified time delay. The delay element is typically an inverting circuit coupled between the first and third nodes. The delay element may, however, be a non-inverting buffer circuit.

The switch turns off in response to a voltage transition of the first signal in one particular direction. By virtue of the transmission delays through the delay element and the (first-mentioned) inverter, one of the FET's turns on briefly when the first signal makes such a transition. This delays the time at which the switch turns off by a controllable amount.

There are a variety of uses for the present switch. It can replace a capacitor in some applications because the delayed turn-off produces a capacitive-like current pulse. For the same reason, the switch can be used in creating dynamic hysteresis. The switch can also be employed to double clock frequencies or make a latch into an edge-sensitive flip-flop.

Like reference symbols are employed in the drawings and in the description of the preferred embodiments to represent the same or very similar item or items. In the drawings, each N-channel FET has an arrow pointing towards its channel. Each P-channel FET has an arrow pointing away from its channel. All of the FET's shown in the drawings discussed below are enhancement-mode insulated-gate devices.

DESCRIPTION OF THE PREFERRED EMBODIMENTS

FIGS. 2a–2d illustrate four general ways for implementing the dynamic switch of the invention. Each of the implementations centers around a transmission gate 16 consisting of complementary FET's $Q_N$ and $Q_P$ connected in parallel between nodes 1 and 2 in the same manner that FET's $Q0_N$ and $Q0_P$ are arranged in the prior art circuit mentioned above. N-channel FET $Q_N$ has a positive threshold voltage $V_{TN}$ which is typically in the vicinity of 1 volt. P-channel FET $Q_P$ has a negative threshold voltage $V_{TP}$ that is usually around $-1$ volt.

Signals $V_1$ and $V_2$ are again respectively present at nodes 1 and 2. During normal operation, signal $V_1$ traverses a voltage range extending from a fixed low supply voltage $V_{LL}$ to a fixed high supply voltage $V_{HH}$. Signal $V_2$ traverses the same voltage range. Letting $V_{PS}$ represent the differential power supply voltage $V_{HH}-V_{LL}$, $V_{PS}$ exceeds both $V_{TN}$ and $|V_{TP}|$. For example, $V_{PS}$ is typically about 5 volts.

An inverter 17 operating in response to signal $V_3$ supplied from node 3 to the gate electrode of one of FET's $Q_N$ and $Q_P$ provides substantially inverse signal $V_4$ to the gate electrode of the other FET. Inverter 17 has its input and output respectively connected to the $Q_N$ gate electrode and the $Q_P$ electrode in the embodiments of FIGS. 2a and 2b. The inverter connections are reversed in the implementations of FIGS. 2c and 2d.

Figure 2A:
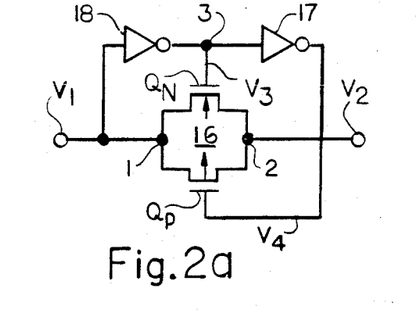
FIGS. 2a, 2b, 2c, and 2d are block/circuit diagrams of four general variations of an edge-sensitive dynamic switch in accordance with the invention.
Figure 2B:
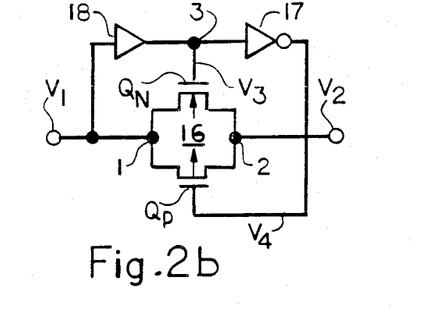
Figure 2C:
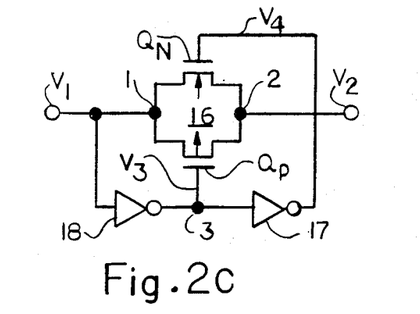
Figure 2D:
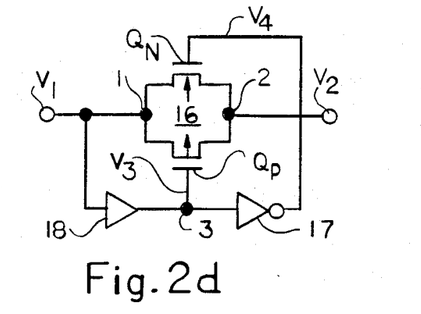

A main delay element 18 responsive to signal $V_1$ generates signal $V_3$ in such a way that changes in signal $V_3$ follow changes in signal $V_1$ either directly or inversely. In FIGS. 2a and 2c, delay element 18 is an inverting circuit whose input and output are respectively connected to nodes 1 and 3. Signal $V_3$ thus inversely follows signal $V_1$ in these two versions of the switch. In FIGS. 2b and 2d, element 18 is a non-inverting buffer circuit having its input and output respectively connected to nodes 1 and 3 so that signal $V_3$ directly follows signal $V_1$.

Figure 2E:
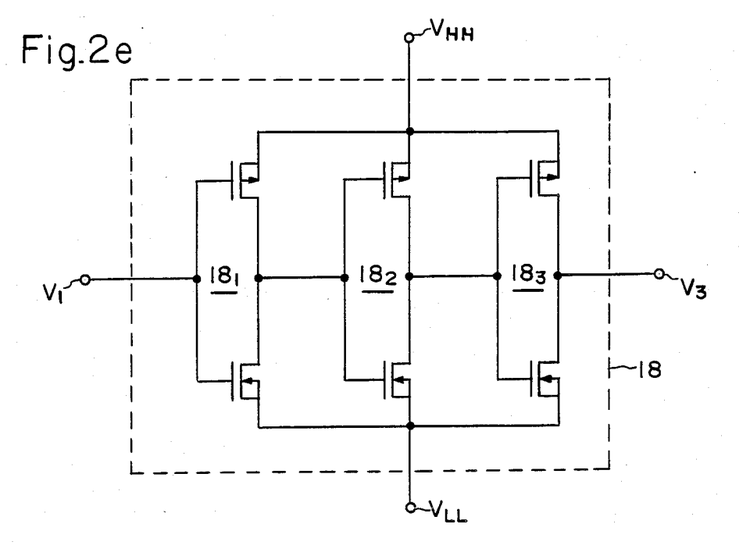
FIGS. 2e and 2f are circuit diagrams for implementations of the main delay element in FIGS. 2a–2d.
Figure 2F:
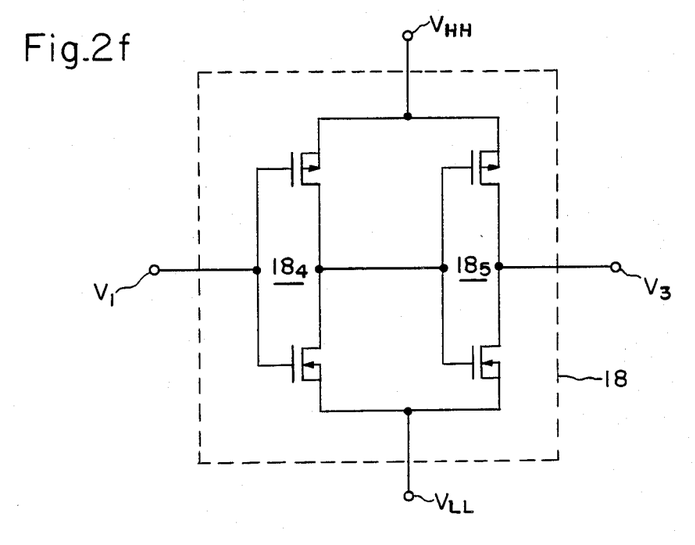

Components 17 and 18 are usually implemented in such a manner that signals $V_3$ and $V_4$ vary across the entire $V_{PS}$ voltage range. For example, inverter 17 may be a conventional CMOS-type inverter consisting of a pair of complementary FET's connected in series between supply lines that receive voltages $V_{LL}$ and $V_{HH}$. Element 18 in FIGS. 2a and 2c can be formed in the same way or as an odd number (e.g., 3, 5, ...) of such inverters connected in series. FIG. 2e illustrates the case in which element 18 consists of three serially connected CMOS-type inverters $18_1$, $18_2$, and $18_3$. Element 18 in FIGS. 2b and 2d can be implemented as an even number (e.g., 2, 4, ...) of conventional CMOS-type inverters connected in series. FIG. 2f shows the case in which element 18 consists of two serially connected CMOS-type inverters $18_4$ and $18_5$.

Figure 3A:
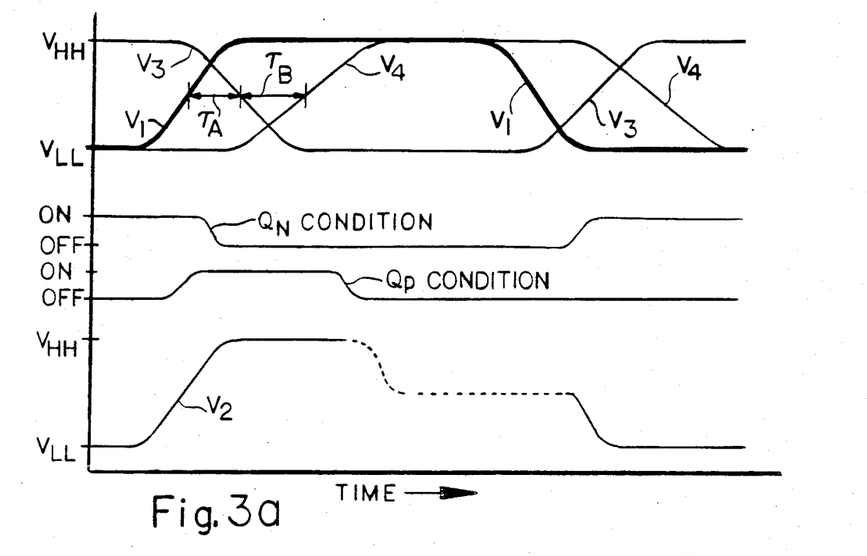
FIGS. 3a and 3b are respective timing diagrams for the versions of the dynamic switch shown in FIGS. 2a and 2b.
Figure 3B:
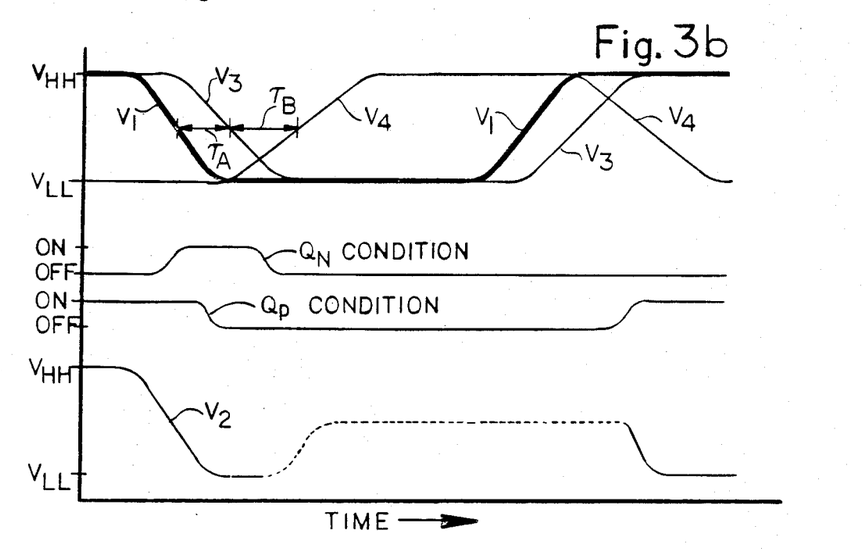

The present switch, as represented by the condition of gate 16 and thus by the conditions of FET's $Q_N$ and $Q_P$, turns off with a controlled time delay in response to a transition of signal $V_1$ in a particular voltage direction. Referring to FIGS. 3a and 3b, they depict timing diagrams helpful in understanding the operation of the switch. FIG. 3a applies specifically to The implementation of FIG. 2a. FIG 3b applies to FIG. 2b. The voltage curves representing signal $V_1$ are shown in thicker line in FIGS. 3a and 3b to help distinguish signal $V_1$ from signals $V_3$ and $V_4$.

$\tau_A$ and $\tau_B$ respectively represent the approximate transmission delays through components 18 and 17 measured from threshold to threshold. That is, $\tau_A$ is the difference between the time at which signal $V_1$ passes the threshold voltage for element 18 and the later time at which signal $V_3$ passes the same voltage in response to the change in signal $V_1$. $\tau_B$ is similarly the time period that signal $V_4$ is delayed relative to signal $V_3$ measured at the threshold voltage for inverter 17. The total transmission delay from signal $V_1$ to signal $V_4$ is $\tau_A + \tau_B$.

The threshold voltages for components 17 and 18 and, consequently, the transmission delay measurement points are typically about halfway between voltages $V_{LL}$ and $V_{HH}$ when components 17 and 18 are implemented using the CMOS-type circuitry described above. This case is shown in FIGS. 3a and 3b.

Turning specifically to FIG. 3a, assume that signal $V_1$ is initially at low voltage $V_{LL}$. $V_3$ is initially at high voltage $V_{HH}$ due to the inversion provided by element 18 in FIG. 2a. FET $Q_N$ is turned on since the $V_3-V_1$ voltage difference equals power supply voltage $V_{PS}$ and is therefore greater than N-channel threshold $V_{TN}$. Gate 16 is turned on. Signal $V_2$ is at $V_{LL}$. Signal $V_4$ is also at $V_{LL}$. Because signal $V_4$ is at the same voltage as signals $V_1$ and $V_2$, FET $Q_P$ is turned off.

$V_1$ is now raised to $V_{HH}$. $V_2$ starts following $V_1$ upward. $V_3-V_1$ drops towards $-V_{PS}$ so as to turn off FET $Q_N$. Delay $\tau_A$ through element 18 extends the time during which FET $Q_N$ is turned on. This assists $V_2$ in its upward rise. FET $Q_N$ turns off when $V_3-V_1$ drops below $V_{TN}$.

$V_4$ also follows $V_1$ upward. Due to delays $\tau_A$ and $\tau_B$ through components 18 and 17, there is a short period of time before FET $Q_N$ turns off during which the $V_4-V_1$ voltage difference temporarily drops below P-channel threshold $V_{TP}$. That is, $V_4$ trails $V_1$ by more than $|V_{TP}|$. This allows FET $Q_P$ to turn on briefly. The dynamic turn on of FET $Q_P$ usually enables $V_2$ to rise all the way up to $V_{HH}$.

FET $Q_P$ turns off when $V_4$ has risen enough that $V_4-V_1$ is greater than $V_{TP}$. With FET $Q_P$ now turned off, gate 16 is turned off. The result is that the time at which gate 16 turns off in response to a low-to-high voltage transition in signal $V_1$ is delayed by an amount dependent on delays $\tau_A$ and $\tau_B$.

After gate 16 turns off node 2 is effectively disconnected from node 1. The variation in the $V_2$ voltage, as indicated by the dotted portion of the $V_2$ curve in FIG. 3a, is now determined by whatever further circuitry is connected to node 2. At a later time, $V_1$ is returned to $V_{LL}$. FET $Q_N$ turns back on to reactivate gate 16. If not already set at $V_{LL}$ by the further circuitry connected to node 2, $V_2$ returns to $V_{LL}$. This completes the cycle.

The situation is similar with the embodiment shown in FIG. 2b except that the roles of FET's $Q_N$ and $Q_P$ are largely reversed so that the switch has a delayed turn-off when $V_1$ makes a high-to-low voltage transition. With reference to FIG. 3b, FET $Q_P$ is turned on during the time that $V_1$ is at $V_{HH}$. Gate 16 is conductive. When $V_1$ is reduced to $V_{LL}$, FET $Q_N$ turns on briefly to delay the time at which gate 16 turns off by an amount determined by delays $\tau_A$ and $\tau_B$.

The implementations of FIGS. 2c and 2d respectively operate in the same way as those of FIGS. 2a and 2b with the voltage polarities and roles of FET's $Q_N$ and $Q_P$ reversed.

When a fast IC interacts with the outside world, the voltages on the internal supply lines often "bounce" up and down. The bounce can cause the IC to operate improperly when it responds to an input signal having a slowly changing voltage. The problem usually becomes more serious as the IC speed increases. FIGS. 4, 5a, 5b, and 6 illustrate an example of how the present dynamic switch is employed in creating dynamic hysteresis to prevent supply line bounce from causing improper IC operation.

Figure 4:
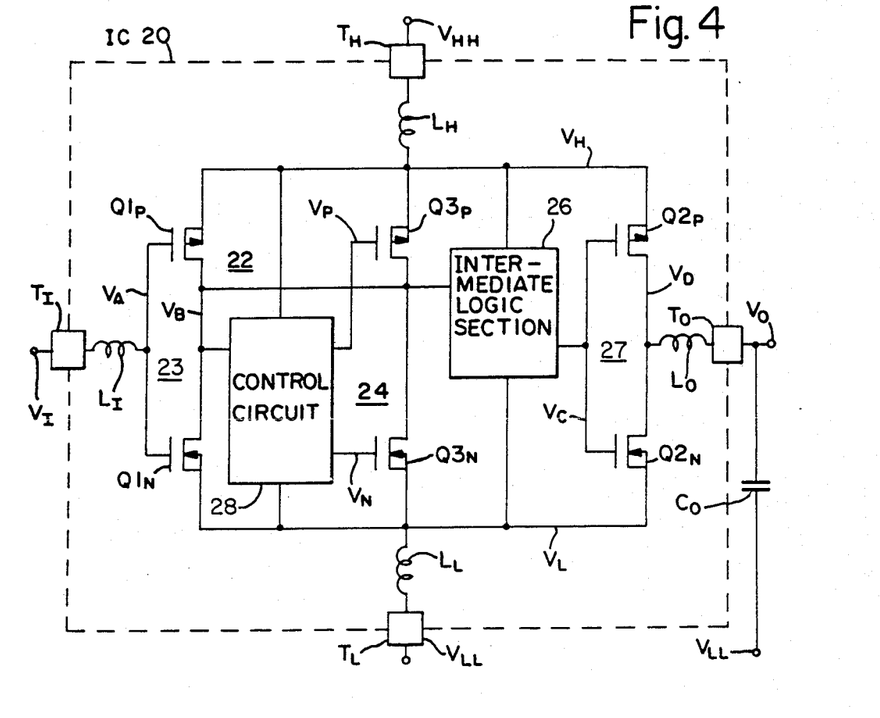
FIG. 4 is a block/circuit diagram for a portion of a digital IC that employs an input inverting device having dynamic hysteresis.

Beginning with FIG. 4, it shows a portion of a digital IC 20 that receives supply voltages $V_{HH}$ and $V_{LL}$ at respective supply terminals (or pads) $T_H$ and $T_L$. IC 20 produces a circuit output voltage $V_O$ at an output terminal $T_O$ in response to a circuit input voltage $V_I$ received at an input terminal $T_I$. A capacitor $C_O$ (real or parasitic) is connected between terminal $T_O$ and the $V_{LL}$ supply.

The illustrated portion of IC 20 is a very fast logic circuit powered by high and low internal supply voltages $V_H$ and $V_L$ provided on lines connected respectively to terminals $T_H$ and $T_L$. Responsive to an internal input voltage $V_A$ supplied on a line connected to terminal $T_I$, the logic circuit produces an internal output voltage $V_D$ on a line connected to terminal $T_O$. Parasitic inductances $L_L$, $L_H$, $L_I$, and $L_O$ are respectively associated with the lines carrying voltages $V_L$, $V_H$, $V_A$, $V_D$.

The logic circuit consists of (a) an input inverting device 22 formed with an input inverter 23 and a dynamic hysteresis circuit 24 that together generate a voltage $V_B$ inverse to voltage $V_A$, (b) an intermediate logic section 26 that operates on voltage $V_B$ and possibly on other input voltages (not shown) to produce a voltage $V_C$ at a value that is logically the same as or inverse to voltage $V_B$, and (c) an output inverter 27 that generates voltage $V_D$ as the inverse of voltage $V_C$. Inverter 23 is a conventional CMOS-type inverter formed with complementary input FET's $Q1_N$ and $Q1_P$. Inverter 27 is similarly formed with complementry output FET's $Q2_N$ and $Q2_P$.

Dynamic hysteresis circuit 24 consists of a control circuit 28 powered by supply voltages $V_H$ and $V_L$, an N-channel FET $Q3_N$, and a P-channel FET $Q3_P$. In response to voltage $V_B$ control circuit 28 supplies threshold-control voltages $V_N$ and $V_P$ to the respective gates of FET's $Q3_N$ and $Q3_P$. FET $Q3_N$ is "in parallel" with FET $Q1_N$. FET $Q3_P$ is similarly in parallel with FET $Q1_P$.

Circuit 24 provides dynamic hysteresis for the threshold voltage $V_T$ of device 22. More particularly, the threshold voltage for an inverter formed with complementary FET's depends on the ratio $R_{P/N}$ of the P-channel width to the N-channel width (at constant channel length). This means the widths of the channel areas that are conducting at the threshold point. The threshold voltage increases when $R_{P/N}$ increases and vice versa.

FET's $Q3_N$ and $Q3_P$ are normally off or at so low conductive levels as to be effectively off. Accordingly, the quiescent value of $R_{P/N}$ for device 22 is simply the $Q1_P$ channel width divided by the $Q1_N$ channel width since FET's $Q1_N$ and $Q1_P$ are both conducting at the threshold point, one in the midst of turning on and the other in the midst of turning off. If FET $Q3_N$ is on but FET $Q3_P$ is off, the N-channel width for device 22 increases since FET's $Q3_N$ and $Q1_N$ are in parallel. $R_{P/N}$ for device 22 is therefore less than its quiescent value. In like manner, $R_{P/N}$ for device 22 is greater than the quiescent value when FET $Q3_P$ is on but FET $Q3_N$ is off.

With the foregoing in mind, device 22 operates as follows. FET's $Q3_N$ and $Q3_P$ are initially off. Supply voltages $V_L$ and $V_H$ are initially at (or very near) respective substantially constant levels $V_{LL}$ and $V_{HH}$. Under these conditions, threshold $V_T$ is at a quiescent value $V_S$ determined by the quiescent $R_{P/N}$ of device 22. When the difference $V_A - V_L$ passes $V_T$, device 22 changes state.

If $V_A$ rises above $V_{LL} + V_S$, FET $Q1_N$ turns on and FET $Q1_P$ turns off. Device 22 as represented by the conductive conditions of FET's $Q1_N$ and $Q1_P$ switches from a high logic state to a low logic state, causing $V_B$ to go from a high level near $V_{HH}$ to a low level near $V_{LL}$. Responsive to this change in $V_B$, control circuit 28 temporarily raises $V_N$ enough to turn FET $Q3_N$ on for a brief period. FET $Q3_P$ remains off. $R_{P/N}$ drops below its quiescent level. This reduces $V_T$ until circuit 28 reduces $V_N$ sufficiently to turn FET $Q3_N$ back off.

Largely the reverse occurs when $V_A$ drops below $V_{LL} + V_S$. FET $Q1_N$ turns off and FET $Q1_P$ turns on, causing device 22 to switch from its low logic state to its high logic state. $V_B$ goes from $V_{LL}$ up to $V_{HH}$. In response to this $V_B$ change, circuit 28 temporarily provides $V_P$ at a sufficiently low voltage to turn FET $Q3_P$ on for a short time. FET $Q3_N$ stays off. Consequently, $R_{P/N}$ rises above its quiescent value so as to increase $V_T$. When circuit 28 subsequently raises $V_P$ to turn off FET $Q3_P$, $V_T$ drops back down.

Now, look at what happens in IC 20 if input $V_I$ changes very slowly. Assume (for example) that logic section 26 provides a voltage inversion so that $V_C$ is the inverse of $V_B$.

First consider how IC 20 would operate if (as in the prior art) dynamic hysteresis circuit 24 were absent. This case is represented by the voltage variations shown in FIG. 5a. Assume that $V_I$ is initially low. Also assume that $V_L$ and $V_H$ are respectively at $V_{LL}$ and $V_{HH}$. $V_A$ is then low, causing $V_B$ to be at $V_{HH}$. $V_C$ is low so that FET $Q2_N$ is turned off and FET $Q2_P$ is turned on. $V_D$ and $V_O$ are both at $V_{HH}$. Capacitor $C_O$ is charged to a high level.

Figure 5A:
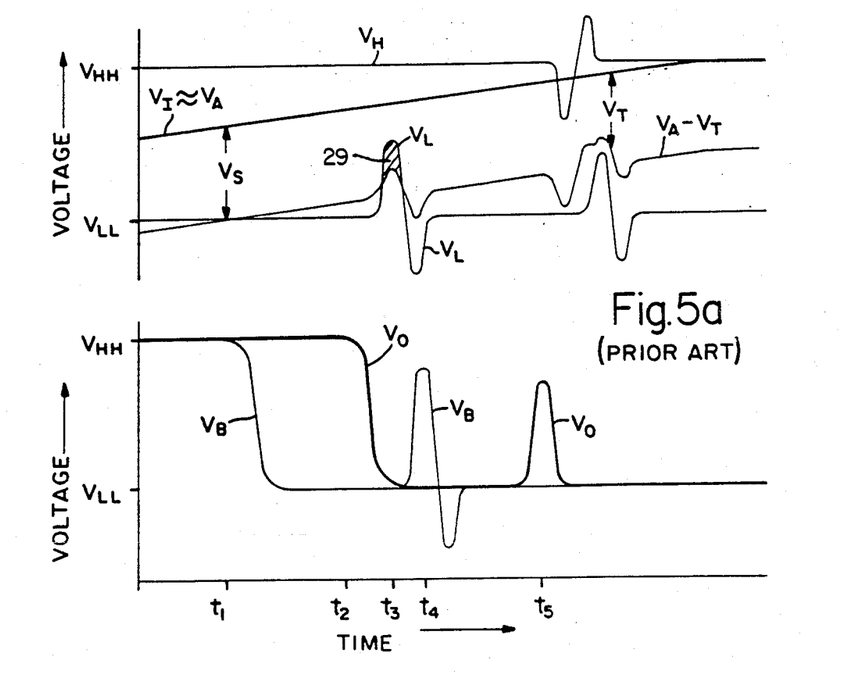
FIGS. 5a and 5b are timing diagrams pertinent to the digital IC in FIG. 4.

As $V_I$ rises slowly, $V_A$ tracks $V_I$ closely. Inductance $L_I$ does not have any significant effect. At a time $t_1$, $V_A$ starts to go above $V_{LL} + V_S$. This causes $V_B$ to drop rapidly to $V_{LL}$. $V_C$ goes high to turn FET $Q2_N$ on and FET $Q2_P$ off. $V_D$ drops rapidly to $V_{LL}$. At a time $t_2$ depending on the transmission delays through components 26 and 27, capacitor $C_O$ starts discharging to the $V_{LL}$ supply by way of a path through elements $L_O$, $Q2_N$, and $L_L$ to pull $V_O$ rapidly down to $V_{LL}$.

The current flowing through this path varies with time in a non-linear manner. Since the voltage across an inductor is the inductance times the time rate of change of current flowing through the inductor, a positive voltage builds up across inductance $L_L$, reaching a maximum at a time $t_3$. A positive (or upward going) spike in $V_L$ thereby occurs at $t_3$ as shown in FIG. 5a. The $V_L$ spike at $t_3$ is the "first" spike in a set of timewise contiguous pairs of alternating apikes that die out quickly, of which only the first pair of alternating spikes are actually shown in FIG. 5a.

The $V_L$ spike at $t_3$ is often so high that $V_A - V_L$ temporarily drops below threshold $V_T$. See shaded area 29 in FIG. 5a. Inverter 23 then makes a pair of rapid changes in logic state at approximately a time $t_4$, causing $V_B$ to spike upwards. In turn, the $V_B$ spike causes a positive $V_O$ spike to occur at a time $t_5$.

The same situation arises if $V_I$ drops slowly, except that the polarities and supply lines are reversed. The first spike is a negative $V_H$ spike that results from the rapid charging of capacitor $C_O$ by way of a path through elements $L_H$, $Q2_P$, and $L_O$.

The $V_O$ spikes and the corresponding spikes in $V_B$, $V_C$, and $V_D$ can be disastrous. They could cause a circuit (such as a flip-flop) responsive to $V_O$, $V_B$, $V_C$, or $V_D$ to be set at a wrong state.

Figure 5B:
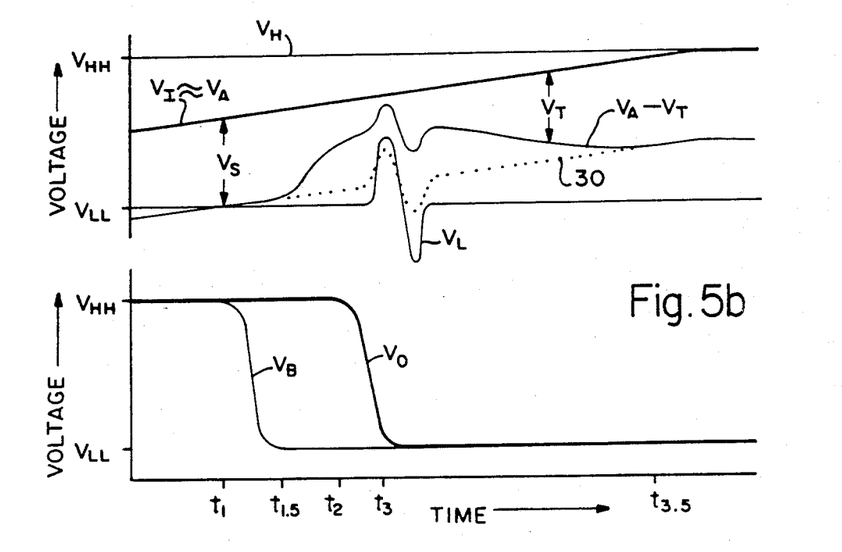

Circuit 24 enables IC 20 to avoid unwanted changes of state that would otherwise occur as a result of supply line bounce. FIG. 5b, which is an analogous timing diagram to FIG. 5a for the case in which circuit 24 is present, is helpful in showing how this is accomplished.

The initial conditions for the case shown in FIG. 5b are the same as those for FIG. 5a. As $V_I$ rises slowly, $V_A$ follows closely. When $V_A$ passes $V_{LL}+V_S$ at time $t_1$, $V_B$ drops rapidly to $V_{LL}$. In response, hysteresis circuit 24 reduces $V_T$ starting at a time $t_{1.5}$. The difference between dotted line 30 and the solid line representing $V_A-V_T$ in FIG. 5b indicates the amount of reduction in $V_T$.

Capacitor $C_O$ starts discharging at time $t_2$. This produces a positive $V_L$ spike at time $t_3$ according to the mechanism described above. Due to the $V_T$ reduction produced by circuit 24, $V_A-V_L$ stays above $V_T$ during the positive $V_L$ spike. Capacitor $C_O$ thereby remains discharged so as to substantially inhibit any further internal supply line voltage bounce. Accordingly, no spikes occur in $V_B$, $V_C$, $V_D$, and $V_O$. At a later time $t_{3.5}$, $V_T$ automatically returns to $V_S$.

The situation in which $V_I$ falls slowly is essentially the complement of that shown in FIG. 5b. In the interval between $t_{1.5}$ and $t_{3.5}$, circuit 24 increases $V_T$ by an amount sufficient to prevent spikes from occurring in $V_B$, $V_C$, $V_D$, and $V_O$. If section 26 supplies $V_C$ at the same logical value as $V_B$, circuit 24 operates in basically the same way to prevent undesired changes in state.

Figure 6:
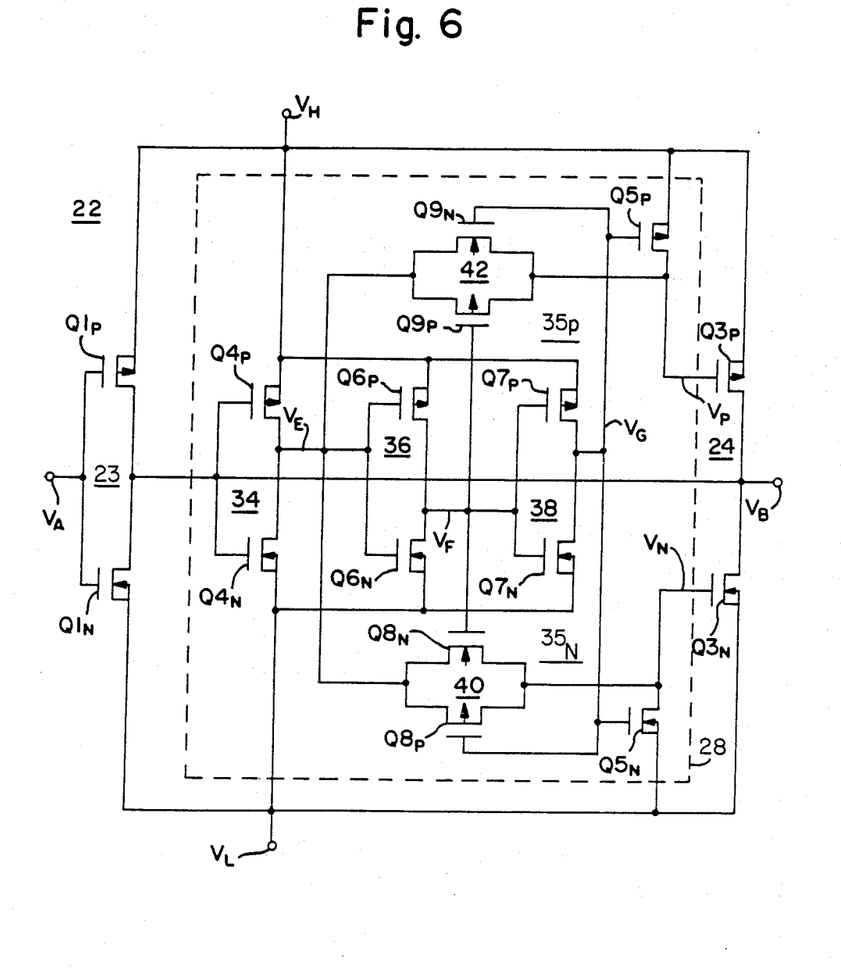
FIG. 6 is a circuit diagram showing how the present switch is employed in a preferred embodiment of the input inverting device of FIG. 4.

The dynamic switch of the invention is employed in a capacitive-like mode in a preferred embodiment of control circuit 28 shown in FIG. 6. Circuit 28 consists of (a) an inverter 34 formed with complementary FET's $Q4_N$ and $Q4_P$ that produce a voltage $V_E$ inverse to voltage $V_B$, (b) dynamic switches $35_N$ and $35_P$ that respectively produce voltages $V_N$ and $V_P$ in response to voltage $V_E$, and (c) complementary discharge FET's $Q5_N$ and $Q5_P$ whose gate electrodes receive a voltage $V_G$. FET $Q5_N$ is source-drain connected between the $V_L$ line and the $Q3_N$ gate. FET $Q5_P$ is source-drain connected between the $V_H$ line and the $Q3_P$ gate.

Switch $35_N$ consists of an inverter 36 that provides a voltage $V_F$ as the inverse of voltage $V_E$, an inverter 38 that produces voltage $V_G$ as the inverse of voltage $V_F$, and a transmission gate 40. Inverter 36 is formed with complementary FET's $Q6_N$ and $Q6_P$. Inverter 38 is formed with complementary FET's $Q7_N$ and $Q7_P$. Transmission gate 40 is formed with complementary FET's $Q8_N$ and $Q8_P$ whose gate electrodes respectively receive voltages $V_F$ and $V_G$. FET's $Q8_N$ and $Q8_P$ have interconnected first source/drain elements connected to the $Q4_N$ and $Q4_P$ drains and interconnected second source/drain elements connected to the $Q3_N$ gate. Consequently, switch $35_N$ is an embodiment of the switch version shown in FIG. 2a.

Switch $35_P$ consists of a transmission gate 42 along with inverters 36 and 38. Gate 42 consists of complementary FET's $Q9_N$ and $Q9_P$ arranged with regard to the $Q3_P$ gate in a manner that is complementary to the arrangement of gate 40 with respect to the $Q3_N$ gate. Switch $35_P$ is thus an embodiment of the version shown in FIG. 2c.

Circuit 28 in FIG. 6 operates as follows. Assume that $V_B$ is initially at $V_{HH}$ so that FET $Q4_N$ is on and FET $Q4_P$ is off. $V_F$ is likewise at $V_{HH}$. $V_E$ and $V_G$ are both at $V_{LL}$. FET $Q8_N$ is on, thereby setting $V_N$ at $V_{LL}$. FET's $Q3_N$, $Q5_N$, and $Q8_N$ are all off.

When $V_B$ drops to $V_{LL}$, FET $Q4_N$ turns off and FET $Q4_P$ turns on. $V_E$ starts rising toward $V_{HH}$. During an initial part of the time needed for inverter 36 to drop $V_F$ down to $V_{LL}$, positive charge from the $V_H$ line flows through FET's $Q4_P$ and $Q8_N$ to the $Q3_N$ gate. $V_N$ starts to rise as FET $Q8_P$ turns on. Although FET $Q8_N$ gradually turns off, positive charge from the $V_H$ line now flows through FET's $Q4_P$ and $Q8_P$ to the $Q3_N$ gate to raise $V_N$ further. This continues for the entire time needed for inverter 36 to raise $V_G$ up to $V_{HH}$. At some point during the charging of the $Q3_N$ gate, FET $Q3_N$ turns on.

When inverter 38 finally switches, FET $Q8_P$ turns off to stop the charging of the $Q3_N$ gate. At this point, FET $Q5_N$ turns on. It opens a path to the $V_L$ line for discharging the $Q3_N$ gate, causing FET $Q3_N$ to turn off. Inverters 36 and 38 and FET's $Q4_N$, $Q9_N$, $Q9_P$, and $Q5_P$ operate in a similar, complementary manner to enable FET $Q3_P$ to turn on briefly when $V_B$ later returns to $V_{HH}$.

If the transmission delay of inverter 36 or 38 is too small to allow enough time to charge the $Q3_N$ gate and/or the $Q3_P$ gate, a further delay element can be placed in series with inverter 36 or 38. The delay element might, for example, consist of a pair of inverters in series.

While the invention has been described with reference to particular embodiments, this description is solely for the purpose of illustration and is not to be construed as limiting the scope of the invention claimed below. For example, junction FET's could be used instead of insulated-gate FET's. Certain of the enhancement-mode FET's could be replaced with depletion-mode FET's. Various modifications and applications may thus be made by those skilled in the art without departing from the true scope and spirit of the invention as defined by the appended claims.

I claim:

1. An electronic circuit comprising (a) a pair of complementary field-effect transistors (FET's), each having a first source/drain element, a second source/drain element, and a gate electrode, the first source/drain elements coupled together through a first node at which a first signal is present, the second source/drain elements coupled together through a second node at which a second signal is present, both of the first and second signals substantially varying between a low voltage level and a high voltage level, and (b) an inverter responsive to a third signal at a third node coupled to the gate electrode of one of the FET's for providing a substantially inverse fourth signal to the gate electrode of the other FET, characterized by delay means for causing the third signal to continually follow the first signal, either directly or inversely, by a specified time delay.

2. A circuit as in claim 1 characterized in that the inverter provides a further time delay such that the fourth signal continually follows the first signal, either inversely or directly, by the sum of the two delays.

3. A circuit as in claim 1 characterized in that the delay means comprises inverting means coupled between the first and third nodes.

4. A circuit as in claim 3 characterized in that the inverting means comprises a single inverter or an odd number of inverters coupled in series.

5. A circuit as in claim 3 characterized in that the FET's are enhancement-mode insulated-gate FET's.

6. A circuit as in claim 1 characterized in that delay means comprises non-inverting buffer means coupled between the first and third nodes.

7. A circuit as in claim 6 characterized in that the buffer means comprises an even number of inverters coupled in series.

8. A circuit as in claim 6 characterized in that the FET's are enhancement-mode insulated-gate FET's.

9. A circuit as in claim 1 further including circuit means coupled to the second node for producing a further signal that varies in response to the second signal as it varies between the low and high voltage levels.

10. A circuit as in claim 9 wherein the circuit means comprises logic means for performing a logical operation.

11. A circuit as in claim 10 characterized in that the inverter provides a further time delay such that the fourth signal continually follows the first signal, either inversely or directly, by the sum of the two delays.

* * * * *